US012805012B2

(12) United States Patent
Baars et al.

(10) Patent No.: US 12,805,012 B2
(45) Date of Patent: Nov. 17, 2026

(54) CRYSTALLINE SEMICONDUCTOR LAYER BETWEEN BIPOLAR TRANSISTOR AND FIELD EFFECT TRANSISTOR STRUCTURES

(71) Applicant: GlobalFoundries U.S. Inc., Malta, NY (US)

(72) Inventors: Peter Baars, Dresden (DE); Halid Mulaosmanovic, Dresden (DE); Zhixing Zhao, Dresden (DE)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 304 days.

(21) Appl. No.: 18/408,704

(22) Filed: Jan. 10, 2024

(65) Prior Publication Data

US 2025/0227999 A1 Jul. 10, 2025

(51) Int. Cl.
*H10D 86/00* (2025.01)
*H10D 10/80* (2025.01)
*H10D 30/63* (2025.01)

(52) U.S. Cl.
CPC ......... *H10D 86/201* (2025.01); *H10D 10/821* (2025.01); *H10D 30/637* (2025.01)

(58) Field of Classification Search
CPC .. H10D 10/027; H10D 30/637; H10D 62/151; H10D 84/0109; H10D 10/60; H10D 10/80; H10D 86/201; H10D 10/821; H10D 62/134; H10D 86/01; H10D 84/038; H10D 84/401; H10W 10/061
See application file for complete search history.

(56) References Cited

U.S. PATENT DOCUMENTS 5,471,083 A 11/1995 Ikeda et al.
6,940,149 B1 9/2005 Divakaruni et al.
6,949,764 B2 9/2005 Ning
7,177,190 B2 2/2007 Lee
7,256,646 B2 8/2007 Eid et al.
7,285,454 B1 10/2007 Liang et al.
8,288,758 B2 10/2012 Ning et al.
(Continued)

FOREIGN PATENT DOCUMENTS

CN 103748785 A 4/2014
CN 109639256 A 4/2019
(Continued)

OTHER PUBLICATIONS

U.S. Appl. No. 17/524,043, Notice of Allowance dated Apr. 5, 2023, 12 pages.

(Continued)

*Primary Examiner* — Wasiul Haider
(74) *Attorney, Agent, or Firm* — Francois Pagette; Hoffman Warnick LLC

(57) ABSTRACT

Embodiments of the disclosure provide a crystalline semiconductor layer between a bipolar transistor structure and a field effect transistor (FET) structure. The structure includes a dielectric layer on a back-gate semiconductor layer, a bipolar transistor structure on the dielectric layer, FET structure on the dielectric layer, and a crystalline semiconductor layer on the dielectric layer between the bipolar transistor structure and the FET structure. The crystalline semiconductor layer includes a terminal of the bipolar transistor structure and a terminal of the FET structure.

18 Claims, 10 Drawing Sheets

(56) References Cited

U.S. PATENT DOCUMENTS

| | | | |
|---|---|---|---|
| 8,531,001 | B2 | 9/2013 | Cai et al. |
| 8,558,282 | B1 | 10/2013 | Cai et al. |
| 8,586,441 | B1 | 11/2013 | Cai et al. |
| 8,846,481 | B2 | 9/2014 | Cantell et al. |
| 9,059,016 | B1 | 6/2015 | Hekmatshoar-Tabari et al. |
| 9,087,705 | B2 | 7/2015 | Chen et al. |
| 9,224,837 | B2 | 12/2015 | Anderson et al. |
| 9,252,233 | B2 | 2/2016 | Hsiao et al. |
| 9,324,705 | B2 | 4/2016 | Ko et al. |
| 9,461,139 | B1 | 10/2016 | Liu |
| 9,536,788 | B1 | 1/2017 | Ning et al. |
| 9,553,085 | B2 | 1/2017 | Tse et al. |
| 9,691,866 | B2 | 6/2017 | Regnier et al. |
| 10,454,591 | B2 | 10/2019 | Voinigescu et al. |
| 10,469,039 | B2 | 11/2019 | Lee et al. |
| 10,707,336 | B1 | 7/2020 | Hashemi et al. |
| 10,790,785 | B2 | 9/2020 | Chen et al. |
| 10,825,921 | B2 | 11/2020 | Balakrishnan et al. |
| 10,896,919 | B2 | 1/2021 | Kanno et al. |
| 11,710,771 | B2 | 7/2023 | Derrickson et al. |
| 11,916,109 | B2 | 2/2024 | Baars et al. |
| 12,308,801 | B2 | 5/2025 | Chen et al. |
| 2001/0054746 | A1 | 12/2001 | Yamada et al. |
| 2002/0153575 | A1 | 10/2002 | Ebina |
| 2006/0044066 | A1 | 3/2006 | Forbes et al. |
| 2009/0015329 | A1 | 1/2009 | Chatterjee et al. |
| 2009/0166721 | A1 | 7/2009 | Denison et al. |
| 2009/0245543 | A1 | 10/2009 | Onodera |
| 2013/0033321 | A1 | 2/2013 | Lindstrand et al. |
| 2013/0256757 | A1 | 10/2013 | Cai et al. |
| 2014/0327083 | A1 | 11/2014 | Park et al. |
| 2014/0361350 | A1* | 12/2014 | Chen ...................... H10D 10/80 257/273 |
| 2014/0375391 | A1 | 12/2014 | Park et al. |
| 2015/0249085 | A1 | 9/2015 | Cai et al. |
| 2015/0349721 | A1 | 12/2015 | Samavedam et al. |
| 2016/0087068 | A1 | 3/2016 | Cai et al. |
| 2016/0093367 | A1* | 3/2016 | Luan ...................... H10B 10/10 365/156 |
| 2016/0300934 | A1 | 10/2016 | Cai et al. |
| 2018/0019185 | A1* | 1/2018 | Costa ................. H10D 30/6734 |
| 2019/0052231 | A1 | 2/2019 | Nomura et al. |
| 2020/0066876 | A1 | 2/2020 | Hashemi et al. |
| 2022/0376093 | A1 | 11/2022 | Derrickson et al. |
| 2023/0069207 | A1 | 3/2023 | Derrickson et al. |
| 2023/0083044 | A1 | 3/2023 | Derrickson et al. |
| 2023/0126578 | A1* | 4/2023 | Reznicek ............. H10D 10/054 257/329 |
| 2023/0198474 | A1 | 6/2023 | Chen et al. |
| 2023/0290829 | A1 | 9/2023 | Baars et al. |
| 2025/0159913 | A1 | 5/2025 | Holt et al. |
| 2025/0219592 | A1 | 7/2025 | Chen et al. |
| 2025/0228009 | A1 | 7/2025 | Zhao et al. |

FOREIGN PATENT DOCUMENTS

| | | | |
|---|---|---|---|
| CN | 106206697 | A | 12/2019 |
| EP | 1126523 | A2 | 8/2001 |
| EP | 1126523 | A3 | 7/2002 |
| EP | 4184588 | A1 | 5/2023 |
| GB | 2538348 | B | 6/2019 |

OTHER PUBLICATIONS

U.S. Appl. No. 17/524,043, Office Action dated Mar. 16, 2023, 13 pages.

U.S. Appl. No. 17/804,201, Notice of Allowance dated Oct. 2, 2023, 12 pages.

U.S. Appl. No. 17/804,201, Office Action dated Jun. 22, 2023, 22 pages.

U.S. Appl. No. 17/804,201, Response to Office Action filed Sep. 22, 2023, 11 pages.

European Search Report for corresponding EP Application No. 22205703.6 dated Jul. 18, 2023, 11 pages.

U.S. Appl. No. 63/238,406, Application entitled Bipolar Transistor Structure With Inner Spacer Alongside Extrinsic Base and Methods to Form Same, filed Aug. 30, 2021, 16 pages.

U.S. Appl. No. 17/804,201, Application entitled Bipolar Transistor Structures With Base Having Varying Horizonal Width and Methods To Form Same, filed May 26, 2022, 40 pages.

Hashemi et al., "Demonstration of Symmetric Lateral NPN Transistors on SOI Featuring Epitaxially Grown Emitter/ Collector Regions," Journal of the Electron Devices Society, vol. 6, May 7, 2018, pp. 537-542.

Cipriany et al., "22nm Technology Yield Optimization Using Multivariate 3D Virtual Fabrication," IEEE 2023, downloaded on Oct. 26, 2023 from IEEE Xplore, pp. 97-100.

Nicolson et al., "Design and Scaling of W-Band SiGe BiCMOS VCOs," IEEE Journal of Solid-State Circuits, vol. 42, No. 9, Sep. 9, 2007, pp. 1821-1833.

Yook et al., "A CMOS W-Band Amplifier with Tunable Neutralization Using a Cross-Coupled MOS-varactor Pair," Electronics 2019, 8, 537, published May 13, 2019, 10 pages.

European Search Report for corresponding EP Application No. 24187639.0-1211 dated Jan. 3, 2025, 11 pages.

European Search Report for corresponding EP Application No. 24187624.2-1211 dated Dec. 23, 2024, 10 pages.

U.S. Appl. No. 18/506,033, Office Action dated Feb. 25, 2026, 17 pages.

Machine Translation of Office Action dated Jun. 27, 2025 in CN Application No. 202211632793, 13 pages.

U.S. Appl. No. 19/085,123, Application as filed on Mar. 20, 2025, 19 pages.

U.S. Appl. No. 17/556,528, Notice of Allowance dated Feb. 13, 2025, 8 pages.

U.S. Appl. No. 17/556,528, Amendment to Final Office Action filed Dec. 30, 2024, 11 pages.

U.S. Appl. No. 17/556,528, Final Office Action dated Nov. 4, 2024, 21 pages.

U.S. Appl. No. 17/556,528, Amendment to Office Action filed Oct. 1, 2024, 12 pages.

U.S. Appl. No. 17/556,528, Office Action dated Jul. 5, 2024, 16 pages.

U.S. Appl. No. 63/268,981, filed Mar. 8, 2022, 30 pages.

U.S. Appl. No. 18/506,033, filed Nov. 9, 2023, 46 pages.

U.S. Appl. No. 18/506,033, Amendment to Office Action filed Apr. 23, 2026, 13 pages.

U.S. Appl. No. 17/524,043, filed Nov. 11, 2021, 22 pages.

U.S. Appl. No. 17/524,043, Amendment to Office Action filed Mar. 20, 2023, 8 pages.

U.S. Appl. No. 18/506,033, Office Action dated Jun. 4, 2026, 14 pages.

* cited by examiner

CRYSTALLINE SEMICONDUCTOR LAYER BETWEEN BIPOLAR TRANSISTOR AND FIELD EFFECT TRANSISTOR STRUCTURES

STATEMENT REGARDING FEDERAL RIGHTS

This invention was made with government support under DARPA T-MUSIC program Agreement No. HR0011-20-3-0002 awarded by the United States Department of Defense. The government has certain rights in the invention.

BACKGROUND

The present disclosure provides a crystalline semiconductor layer between a bipolar transistor structure and a field effect transistor structure.

Conventional integrated circuits may employ heterojunction bipolar transistors (HBTs). Historically, HBTs were vertically oriented. Lateral bipolar transistors are currently under development, at least in part, to allow for easy integration into complementary metal oxide semiconductor (CMOS) process flows for semiconductor-on-insulator structures (e.g., silicon-on-insulator (SOI) structures). Efficiently integrating lateral bipolar transistors into the same device layer as field effect transistors (FETs) is a technical challenge.

SUMMARY

The illustrative aspects of the present disclosure are designed to solve the problems herein described and/or other problems not discussed.

Embodiments of the disclosure provide a structure including: a dielectric layer on a back-gate semiconductor layer; a bipolar transistor structure on the dielectric layer; a field effect transistor (FET) structure on the dielectric layer; and a crystalline semiconductor layer on the dielectric layer between the bipolar transistor structure and the FET structure, wherein the crystalline semiconductor layer includes a terminal of the bipolar transistor structure and a terminal of the FET structure.

Other embodiments of the disclosure provide a structure including: a dielectric layer on a back-gate semiconductor layer; a crystalline semiconductor layer on the dielectric layer; a base structure on the dielectric layer and adjacent a first horizontal end of the crystalline semiconductor layer; and a gate structure on the dielectric layer and adjacent a second horizontal end of the crystalline semiconductor layer, wherein the crystalline semiconductor layer is horizontally between the base structure and the gate structure.

Additional embodiments of the disclosure provide a structure including: a dielectric layer on a back-gate semiconductor layer; a contact to the dielectric layer; an emitter/collector (E/C) layer on the dielectric layer and adjacent a first horizontal end of the contact; a base structure on the dielectric layer and adjacent the E/C layer, wherein the E/C layer is horizontally between the base structure and the contact; a source/drain (S/D) layer on the dielectric layer and adjacent a second horizontal end of the contact; and a gate structure on the dielectric layer and adjacent the S/D layer, wherein the S/D layer horizontally between the contact and the gate structure.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
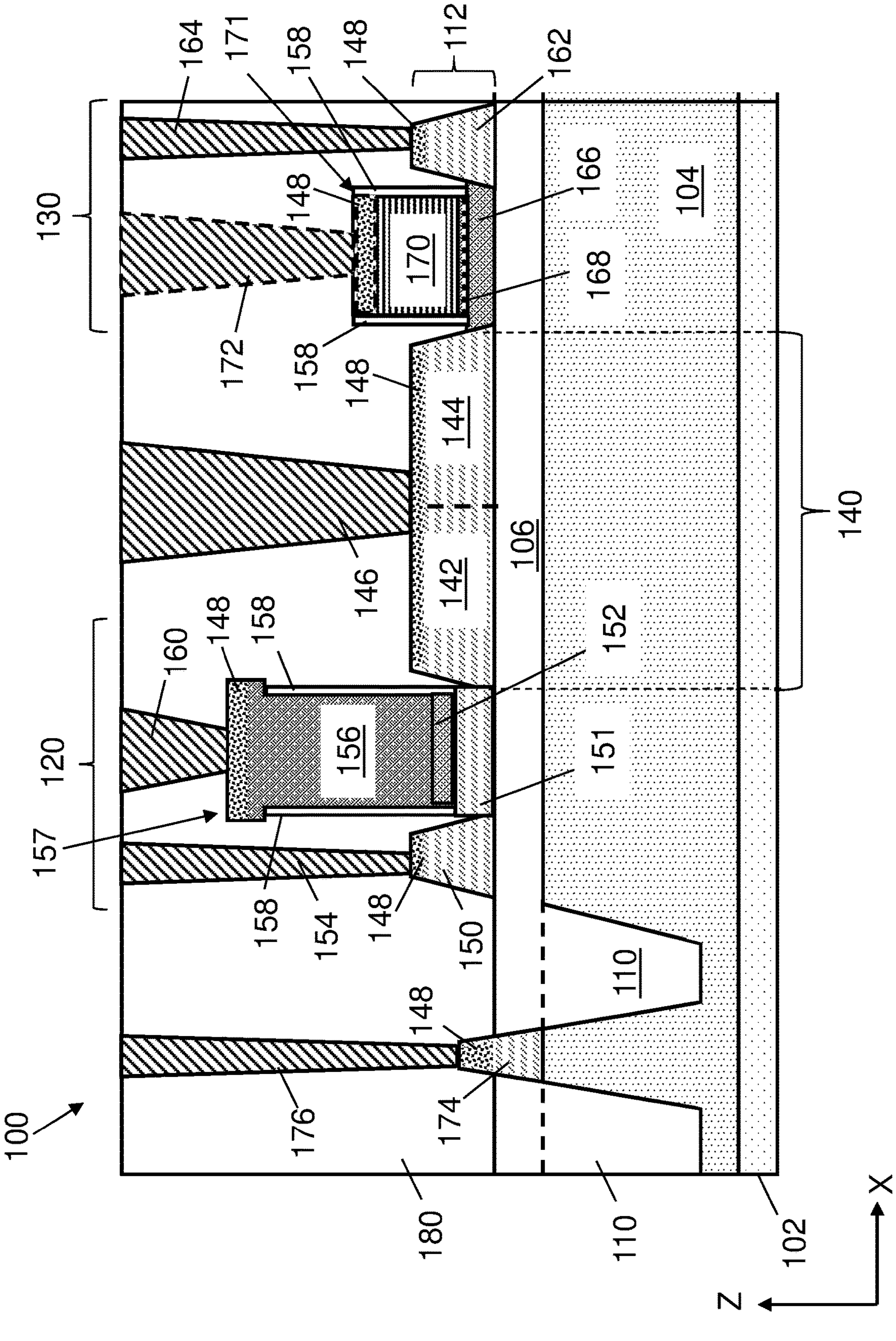
FIG. 1 shows a cross-sectional view of a crystalline semiconductor layer between a bipolar transistor structure and a field effect transistor (FET) structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure provide a crystalline semiconductor layer between a bipolar transistor structure and a field effect transistor (FET) structure. The structure includes a dielectric layer on a back-gate semiconductor layer, a bipolar transistor structure on the dielectric layer, FET structure on the dielectric layer, and a crystalline semiconductor layer on the dielectric layer between the bipolar transistor structure and the FET structure. The crystalline semiconductor layer includes a terminal of the bipolar transistor structure and a terminal of the FET structure. As compared with conventional device structure, the crystalline semiconductor layer may allow emitter/collector (E/C) and source/drain (S/D) terminals to be defined in portions of the same active semiconductor material. In some cases, the various terminals may be defined in a continuous crystalline semiconductor layer. In other cases, a contact may be horizontally between the E/C terminal and the S/D terminal. The gate and base of the transistor, optionally, may be coupled together in another part of the device layer. The bipolar transistor structure and FET structure each may be over one or more back-gate semiconductor materials and may be configured for simultaneous back-gate biasing or independent back-gate biasing in various embodiments.

Bipolar junction transistor (BJT) may be in the form of heterojunction bipolar transistors (HBTs). Heterojunction bipolar transistors differ from other bipolar transistors, e.g., by including different types of semiconductor materials together with different types of doping. As discussed herein, the base of an HBT may be silicon germanium (SiGe) whereas the emitter and collector terminals may include crystalline silicon (Si). HBTs and other BJT structures operate using multiple "P-N junctions." The term "P-N" refers to two adjacent materials having different types of conductivity (i.e., P-type and N-type), which may be induced through dopants within the adjacent material(s). Doping generally refers to a process by which foreign materials ("dopants") are added to a semiconductor structure to alter its electrical properties, e.g., resistivity and/or conductivity. Where a particular type of doping (e.g., p-type or n-type) doping is discussed herein, it is understood that an opposite doping type may be implemented in alternative embodiments. Implantation, where applicable, refers to a doping process in which ions are accelerated toward a solid surface to penetrate the solid up to a predetermined range based on the energy of the implanted ions. Doping also may be implemented by epitaxially growing different conductivity type semiconductor materials in contact with each other, i.e., in-situ doping during epitaxy. In-situ doped epitaxy may be particularly suitable to form HBT structures as discussed herein.

A P-N junction, when formed in a device, may operate as a diode. A diode is a two-terminal element, which behaves differently from conductive or insulative materials between two points of electrical contact. Specifically, a diode provides high conductivity from one contact to the other in one voltage bias direction (i.e., the "forward" direction), but provides little to no conductivity in the opposite direction (i.e., the "reverse" direction). In the case of the P-N junction, the orientation of a diode's forward and reverse directions may depend on the type and magnitude of bias applied to the material composition of one or both terminals, affecting the size of the potential barrier. In the case of a junction between two semiconductor materials, the potential barrier will be formed along the interface between the two semiconductor materials.

Referring to FIG. 1, a structure 100 according to embodiments of the disclosure is shown. Structure 100 may be on a substrate 102 including, e.g., one or more semiconductor materials. Substrate 102 may include but is not limited to silicon, germanium, silicon germanium (SiGe), silicon carbide (SiC), or any other common IC semiconductor substrates. In the case of SiGe, the germanium concentration in substrate 102 may differ from other SiGe-based structures described herein. A portion or entirety of substrate 102 may be strained, and/or may be doped to any desired polarity or concentration. In addition, some portions of substrate 102 may be doped to provide deep wells, e.g., for other device structures on substrate 102 not explicitly shown or discussed herein.

Structure 100 may include embedded elements for electrically separating active materials formed over substrate 102 from other regions and/or materials. Some areas of substrate 102 may be doped to provide a back-gate semiconductor layer 104. Back-gate semiconductor layer 104 can specifically be a monocrystalline semiconductor layer with P-type or N-type for conductivity and to allow electric biasing. Back-gate semiconductor layer 104 can be a doped bulk semiconductor material or, in other examples, may be a crystalline silicon layer or a monocrystalline layer of any other suitable semiconductor material (e.g., silicon germanium). An insulator layer 106 can be above substrate 102 and back-gate semiconductor layer 104. Insulator layer 106 can be, for example, an oxide layer (also referred to herein as a buried oxide (BOX) layer), such as a silicon dioxide layer, or a layer of any other suitable insulator material.

Structure 100 also may include one or more trench isolation layers (TI(s)) 110. TI(s) 110 may be made by forming and filling trenches (not labeled) with an insulating material such as oxide. TI(s) 110 horizontally isolate insulator layer 106, back-gate semiconductor layer 104, and other components thereon (e.g., bipolar transistor and field effect transistor (FET) structures discussed herein) from any adjacent regions of material. Various portions of structure 100, including the active semiconductor materials thereof and/or other devices where applicable, may be formed on or above portions of insulator layer 106 that are isolated by TI(s) 110. One TI 110 is shown in FIG. 1 as an example, but multiple TI(s) 110 may be provided as discussed elsewhere herein to isolate structure 100 from different types of structures and/or components. An active semiconductor layer 112 (e.g., a semiconductor on insulator (SOI) layer and/or other layer(s) of doped semiconductor material) on insulator 106 and separated from other structures by TI(s) 110 can define an active device region for a bipolar junction transistor 120 and a field effect transistor 130 over substrate 102. TI(s) 110 may be formed before active semiconductor layer 112 is formed over substrate 102, but this is not necessarily true in all implementations.

Insulator layer 106 and TI(s) 110 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof. Active semiconductor layer 112 may be on insulator layer 106, e.g., due to being formed by deposition and epitaxial growth of semiconductor material (s). In other cases (e.g., where an SOI stack is not used), active semiconductor layer 112 and TI(s) 110 may be planarized (e.g., by chemical mechanical planarization or other technique(s)) such that the upper surface(s) thereof is/are substantially coplanar with each other) such that the upper surface of active semiconductor layer 112 is substantially coplanar with TI(s) 110.

Insulator layer 106 may extend horizontally throughout structure 100, and/or may be the layer on which active materials are formed and/or defined. In further implementations, insulator layer 106 may include oxygen doping to form a dielectric insulator or a buried oxide ("BOX") layer over substrate 102 and back-gate semiconductor layer 104 to electrically isolate overlying active materials from back-gate semiconductor layer 104 and/or substrate 102. Insulator layer 106 thus may include other elements or molecules such as Ge, N, or Si. However embodied, insulator layer 106 may be sized as narrow as possible to provide better interaction with overlying semiconductor materials. In various embodiments, insulator layer 106 may have a vertical thickness of approximately two nanometers (nm), but may have a variety of thicknesses such as approximately twenty nm, approximately five-hundred nm, etc. Some portions (not shown) of substrate 102 and/or back-gate semiconductor layer 104 may not have insulator layer 106 thereover, and/or multiple layers of insulator layer 106 may be formed on substrate 102 to varying thicknesses. Additionally, various conductive particles ("dopants") may be introduced into substrate 102 as discussed herein via a process known as "pre-doping" of substrate 102. It is understood that substrate 102 can be separately connected and used as a "back bias" to modify the operation of some or all of the devices located above the insulator layer 106, even though such couplings are not explicitly shown in the accompanying figures for clarity of illustration.

A heterojunction bipolar transistor (HBT) structure 120 and a FET structure 130 each can be formed on and within respective portions of active semiconductor layer 112 that are bounded within TI(s) 110. Embodiments of structure 100 structurally integrate BT structure 120 with FET structure 130 by providing a crystalline semiconductor layer within semiconductor layer 112. The forming of structure 100 may include, e.g., providing a fully depleted semiconductor on insulator (FDSOI) substrate including a thin layer of insulative material between two semiconductor layers. Various isolation regions (i.e., TI(s) 110 discussed herein) are patterned to expose parts of the substrate that initially are below the insulator layer. Various gate structures (e.g., dummy gates) may be formed on the upper semiconductor layer of the FDSOI substrate. Spacers 158 are then formed on the gate structures, and one or more of the gate structures may be removed and replaced with functional transistor gates or base structure for an HBT as discussed herein. Crystalline semiconductor layer 140 can be formed by epitaxial growth between, and thus may be shared between, the base and gate components of BT structure 120 and FET structure 130. Crystalline semiconductor layer 140 may be doped, e.g., by in-situ doping and/or doping during formation of semiconductor material over insulator layer 106 and/or back-gate semiconductor layer 104. According to an example, crystalline semiconductor layer 140 may have the same doping polarity as back-gate semiconductor layer 104, e.g., they each may have n-type doping. It is understood that localized implants and/or dopant diffusion from subsequent anneal steps may result in dopants of the same type as crystalline semiconductor layer 140 also being in portions of back-gate semiconductor layer 104 below crystalline semiconductor layer 140.

Crystalline semiconductor layer 140 may be subdivided into different regions, each providing active semiconductor material for one terminal of BT structure 120 and FET structure 130, respectively. Specifically, crystalline semiconductor layer 140 may include an emitter/collector (E/C) terminal 142 and a source/drain (S/D) terminal 144, defined by relative proximity to BT structure 120 and FET structure 130. Crystalline semiconductor layer 140 itself may be structurally continuous, and hence may not include material boundaries, interfaces, and/or other physical features for differentiating between terminals 142, 144. In the case where BT structure 120 is to the left of crystalline semiconductor layer 140 and FET structure 130 is to the right of crystalline semiconductor layer 140, E/C terminal 142 may be the left half of crystalline semiconductor layer 140 and S/D terminal 144 may be the right half of crystalline semiconductor layer 140. Conversely where BT structure 120 is to the right of crystalline semiconductor layer 140 and FET structure 130 is to the left of crystalline semiconductor layer 140, E/C terminal 142 may be the right half of crystalline semiconductor layer 140 and S/D terminal 144 may be the left half of crystalline semiconductor layer 140. Any other conceivable configuration and/or orientation of terminals 142, 144 within crystalline semiconductor layer 140 is possible. One or more intermediate contacts 146 may provide the vertical electrical coupling between crystalline semiconductor layer 140 and overlying metal wires and/or vias. Some portions of crystalline semiconductor layer 140 may be converted into a silicide layer 148 to improve conductivity between intermediate contact(s) 146 to crystalline semiconductor layer 140, e.g., by providing a conductive metal such as cobalt (Co), titanium (Ti), nickel (Ni), platinum (Pt), or similar material on the upper surface(s) of a targeted material. The conductive material may be annealed while in contact with the underlying semiconductor to produce silicide layer 148 for electrically coupling semiconductor materials to contacts formed thereon. Excess conductive material can then be removed using any now known or later developed solution, e.g., etching.

BT structure 120 includes E/C terminal 142 of crystalline semiconductor layer 140 and other components located over dielectric layer 106. Bipolar transistor structure also includes an E/C layer 150 on insulator layer 106, horizontally distal to crystalline semiconductor layer 140. E/C layer 150 may be formed through similar processes (or in some cases, the same processes) implemented to form crystalline semiconductor layer 140 on insulator layer 106. E/C layer 150 may have a same doping type and/or similar dopant concentration as E/C terminal 142 of crystalline semiconductor layer 140. E/C layer 150 can be monocrystalline in structure. E/C layer 150 optionally may have a different composition (e.g., silicon germanium (SiGe)) relative to back-gate semiconductor layer 104 and/or crystalline semiconductor layer 140, but typically will have the same composition as crystalline semiconductor layer 140. An E/C contact 154 formed of one or more metals or other conductors may be on E/C layer 150 to electrically couple E/C layer 150 to overlying metal wires and/or vias. E/C layer 150 also may include silicide layer thereon to improve electrical conductivity between E/C layer 150 and E/C contact 154.

BT structure 120 includes an intrinsic base 152 on an SOI layer 151 (i.e., a non-doped or lightly doped semiconductor material) that is horizontally between E/C layer 150 and E/C terminal 142 of crystalline semiconductor layer 140, and an extrinsic base 156 on intrinsic base 152. Intrinsic base 152 and extrinsic base 156 together provide a base structure 157 to control current flow between E/C layer 150 and E/C terminal 142 of crystalline semiconductor layer 140. Base structure 157 itself defines the base terminal of BT structure 120. Intrinsic base 152 may be p-type doped monocrystalline SiGe, and/or similar semiconductor materials having an opposite conductivity type from E/C terminal 142 and E/C layer 150 but with relatively low amounts of doping. Intrinsic base 152 may be located on SOI layer 151 and above insulator layer 106, above the back-gate semiconductor layer 104 (as illustrated by example in FIGS. 1, 3, 5, 7). Intrinsic base 12 may be grown on SOI layer 151 during any conventional replacement gate process and within spacers 158. Optionally, portions of SOI layer 151 may be removed to decrease its vertical thickness as much as possible, while retaining sufficient semiconductor material to enable epitaxial growth thereon. The doping type of intrinsic base 152 may be adjustable to provide NPN or PNP-conductivity types in a bipolar transistor. Extrinsic base 156 may have the same doping polarity as intrinsic base 152 but with a higher dopant concentration. Extrinsic base 156 may be formed by selective epitaxial growth of polycrystalline semiconductor in an opening above intrinsic base 152.

BT structure 120 also may include a set of spacers 158 on outer surfaces of extrinsic bases 156, and in some cases, on sidewalls of intrinsic base 152. Spacers 158 can be provided as one or more bodies of insulating material formed on the upper surface of a material, e.g., by deposition, thermal growth, etc., to electrically and physically insulate materials subsequently formed on the coated material(s) from other components. According to an example, spacers 158 may have one or more nitride insulator materials (e.g., SiN) or other types of insulator materials (e.g., $SiO_2$) formed to a desired thickness. In this case, spacers 158 may be formed, e.g., by nitriding exposed outer surfaces (e.g., sidewalls) of an initial gate structure (e.g., a "dummy gate") to convert its material composition into a nitride insulator (e.g., converting from poly-Si to silicon dioxide (SiN) or other semiconductor oxides).

In addition to providing electrical insulation, spacers 158 may affect the shape of extrinsic base 156 over intrinsic base 152. For instance, extrinsic base 156 may be substantially T-shaped by having a lower portion that is horizontally between (e.g., physically constrained by) spacers 158, and an upper portion that extends horizontally over (and thus overhangs) spacers 158. Extrinsic base 156 may have a substantial T-shape as a result of forming base structure 156 within spacers 158, i.e., by forming an initial gate structure (not shown) and replacing the initial gate structure with base structure 157. An advantage of this processing configuration is to provide more contact area for contacts to land on base structure 157. However, in further implementations, extrinsic base 156 may have any of a variety of structural configurations that are not T-shaped. The position and size of spacers 158 may be controlled during processing to further affect the size and shape of extrinsic base 156. It is understood that base material may be formed to have other geometries (e.g., shapes other than a "T") by omitting or changing the shape or position of spacers 158. Extrinsic base 156 also may include silicide layer 148 thereon for stronger coupling to a base contact 160. Silicide layer 148 may be formed by the same process, or in the same stage of processing, as other materials having silicide layer 148 discussed herein.

FET structure 130 also may be coupled to crystalline semiconductor layer 140 and may include S/D terminal 144 of crystalline semiconductor layer 140. FET structure 130 also includes an S/D layer 162 on insulator layer 106, and a channel layer 166 horizontally between crystalline semiconductor layer 140 and S/D layer 162. S/D layer 162 may have the same (or similar) material composition and doping profile to S/D terminal 144. S/D terminal 144 of crystalline semiconductor layer 140 and S/D layer 162 each may have the same conductivity type, e.g., p-type doping. Channel layer 166 also may be above back-gate semiconductor layer 104 and insulator layer 106 but may have an opposite doping type as compared to S/D terminal 144 and S/D layer 162. In the case where BT structure 120 provides an "NPN" transistor structure, intrinsic base 152 and channel layer 166 may have the same doping type. Back-gate semiconductor layer 104 itself may define a back-gate terminal for BT structure 120 and FET structure 130 as discussed in detail herein.

Other portions of FET structure 130 may be between S/D terminal 144, S/D layer 162, and over channel layer 166. FET structure 130 for instance may include a gate dielectric layer 168 that may include any thin layer of dielectric material capable of preventing electrical coupling between channel region 166 and electrically active material(s) over gate dielectric layer 168 while allowing electric fields within a gate conductor 170 to influence the electrical conductivity within channel region 166. Gate dielectric layer 168 may include, e.g., a "high-k" dielectric material (i.e., any material having a dielectric constant of at least 3.9) or other currently known or later developed gate dielectric materials, and as examples may include hafnium silicate (HfSiO), hafnium oxide ($HfO_2$), zirconium silicate ($ZrSiO_x$), zirconium oxide ($ZrO_2$), silicon oxide ($SiO_2$), silicon nitride ($Si_3N_4$), silicon oxynitride (SiON), or any combination of these materials.

A gate conductor 170 including a conductive metal (e.g., copper, aluminum, and/or other metal wiring materials), and/or an active semiconductor material (e.g., doped polycrystalline Si and/or SiGe) may be over gate dielectric layer 168. In the case where gate conductor 170 includes active semiconductor material, gate material 170 may include silicide layer 148 thereon for improving the electrical interface between gate conductor 170 and metal wires and/or vias coupled thereto. Together, gate dielectric layer 168 and gate conductor 170 define a gate structure 171. Gate structure 171 itself may define the gate terminal of FET structure 130. A gate contact 172 may vertically couple gate conductor 170 to metal wires, vias, and/or other components through wiring layers (not shown). Gate contact 172 is shown in dashed lines to indicate that it may be in a different plane than the other components shown in FIG. 1. Another set of spacers 158 also may cover sidewalls of gate conductor 170, e.g., in a manner similar to that of extrinsic base 156.

Back-gate semiconductor region 104 can be electrically coupled to a back-gate terminal 174 to further influence the characteristics of BT structure 120 and/or FET structure 130, e.g., the conductivity within crystalline semiconductor layer 140 and/or other layers 150, 162. Concurrent back biasing of BT structure 120 and FET structure 130 can be achieved by applying a single biasing voltage ("Vbg") to back-gate terminal 174, which in turn electrically biases the interconnected portions of back-gate semiconductor region 104 below insulator layer 106 and below structures 120, 130. In some embodiments, structures 120, 130 can be zero back biased (e.g., by applying a Vbg of 0.0V to back-gate terminal 174). In other embodiments, structures 120, 130 could be either forward back biased or reversed back biased. Those skilled in the art will recognize that forward back biasing (FBB) refers to biasing conditions where the particular Vbg causes the emitter or collector of BT structure 120 to be at a higher potential or reduces the threshold voltage of FET structure 130. Reverse back biasing (RBB) refers to biasing conditions where the particular Vbg has opposite effects on BT structure 120 (e.g., it may put the collector at a higher potential in the case where FBB puts the emitter at a higher potential) or increased the threshold voltage of FET structure 130. The presence of E/C terminal 142 and S/D terminal 144 within crystalline semiconductor layer 140 causes the same amount of back biasing to be applied to each structure 120, 130 through back-gate terminal 174.

A back-gate contact 176 may be on back-gate terminal 174 (e.g., it may be in contact with silicide layer 148) to provide electrical coupling between back-gate semiconductor layer 104 and overlying metal wires and/or vias. As with other semiconductive components discussed herein, silicide layer 148 may be on back-gate terminal 174. Applying an electrical potential to back-gate semiconductor region 104 through back-gate terminal 174 can induce an electric charge within back-gate semiconductor region 104, thereby creating a difference in electrical potential between back-gate semiconductor region 104 and other semiconductive materials (e.g., crystalline semiconductor layer 140, E/C layer 150, intrinsic base 152, S/D layer 162, channel layer 166, etc.) across insulator layer 106. Among other effects, this difference in electrical potential between back-gate semiconductor region 104 and overlying semiconductor layers can affect electrical properties, e.g., the biasing of transistor structure, FET structure 130, etc. For instance, electrical biasing of back-gate semiconductor region can raise or lower threshold voltage of FET structure 130, i.e., the minimum voltage for inducing electrical conductivity across channel region 166 from S/D terminal 144 to S/D layer 166.

Structure 100 may include an inter-level dielectric (ILD) layer 180 over insulator layer 106 and any other components thereon. ILD layer 180 may include the same insulating material as insulator layer 106 or may include a different electrically insulative material for vertically separating active materials from overlying materials, e.g., various horizontally extending wires or vias. ILD layer 180 and insulator layer 106 nonetheless constitute different components, e.g., due to insulator layer 106 being vertically between back-gate semiconductor layer 104 and the various components of BT structure 120, FET structure 130, crystalline semiconductor layer 140, etc. ILD layer 180 may be formed by deposition and/or other techniques to provide electrically insulating materials, and can then be planarized (e.g., using CMP), such that its upper surface remains above active semiconductor layer 112, BT structure 120, FET structure 130, crystalline semiconductor layer 140, etc.

As discussed previously, structure 100 includes various contacts 146, 154, 160, 164, 172, 176 for electrically coupling structure 100 to overlying metal wires or vias (not shown). Contacts 146, 154, 160, 164, 172, 176 may be formed within predetermined portions of ILD layer 180 by a controlled amount of vertical etching to form openings to one or more contact sites, and then filling the openings with a conductor. Each contact 146, 154, 160, 164, 172, 176 may include any currently known or later developed conductive material configured for use in an electrical contact, e.g., tungsten (W), copper (Cu), aluminum (Al), etc. Contacts 146, 154, 160, 164, 172, 176 may additionally include refractory metal liners (not shown) positioned alongside ILD layer 180 to prevent electromigration degradation, shorting to other components, etc.

Figure 2:
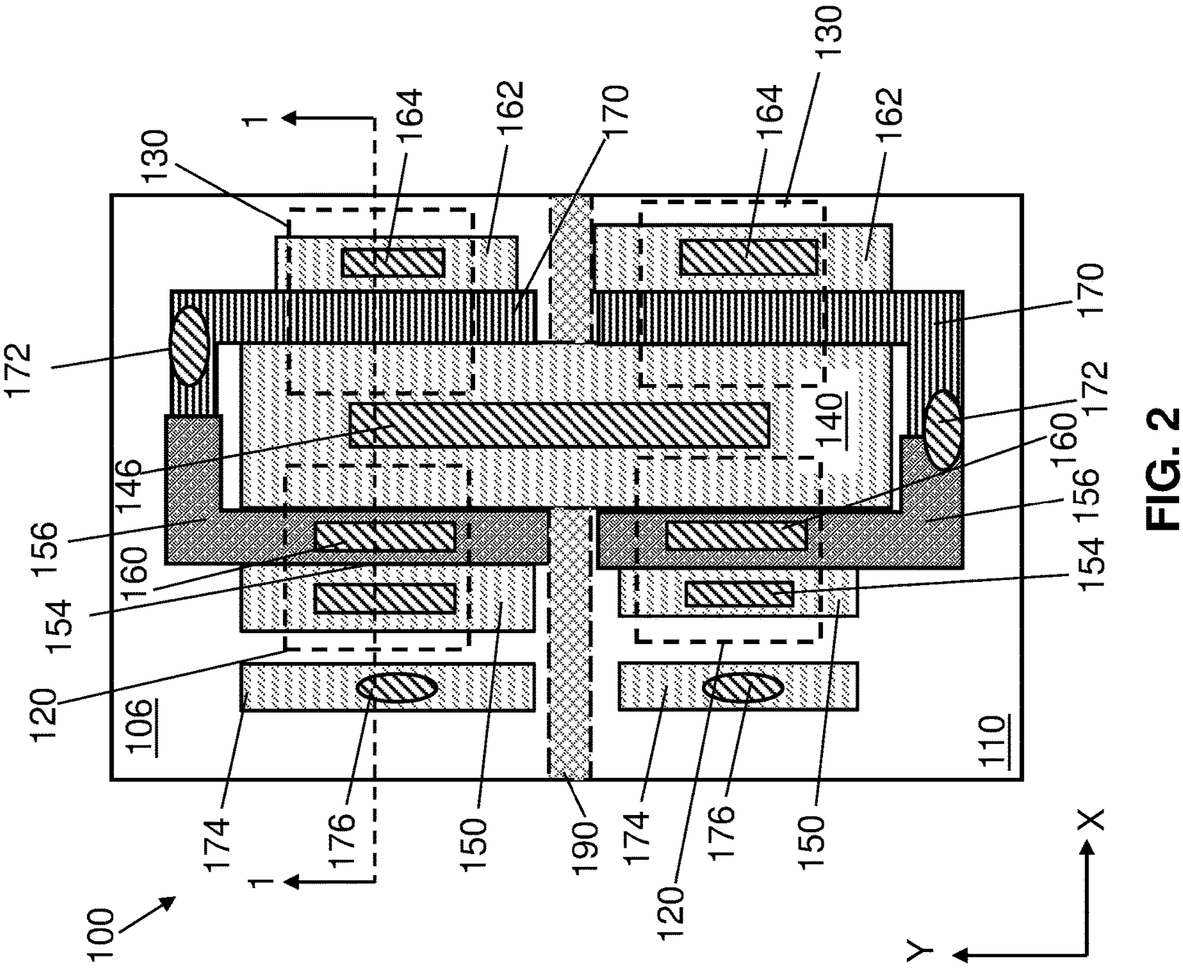
FIG. 2 shows a plan view of a structure according to embodiments of the disclosure.

FIG. 2 depicts a plan view of structure 100 with the cross-sectional view shown in FIG. 1 indicated through view line 1-1. Optionally, BT structure 120 and FET structure 130 may be coupled together through base contact 160 and/or gate contact 172 that is shared between extrinsic base 156 and gate conductor 170. In this case, only one of base contact 160 or gate contact 172 may be included such that the contact 160, 172 present in structure 100 is a single node for electrical coupling to extrinsic base 156 and gate conductor 170. To provide this feature, a portion of extrinsic base 156 may overlap and physically interface with gate conductor 170 over TI(s) 110 at a location distal to crystalline semiconductor layer 140. In alternative implementations, gate conductor 170 may be vertically above and electrically coupled to extrinsic base 156. Among other benefits, coupling of extrinsic base 156 to gate conductor 170 may allow a single conductor to control multiple transistor structures 120, 130, and/or reduce the number of wiring layers and/or conductive vias needed to operate structure 100.

FIG. 2 also depicts crystalline semiconductor layer 140 as extending laterally beyond the space between two pairs of transistor structures 120, 130, e.g., allowing one crystalline semiconductor structure 140 to define E/C terminals 142 and S/D terminals 144 for each pair of transistor structures 120, 130. To electrically separate each pair of transistor structures 120, 130 from each other, a deep well barrier 190 (e.g., semiconductor material having an opposite doping type from active semiconductor materials in structure 100) may be horizontally between the two pairs of transistor structures 120, 130 (e.g., horizontally between transistor structures 120, 130 along the Y axis as shown). Although two pairs of transistor structures 120, 130 with deep well barrier 190 are shown in FIG. 2, it is understood that any desired number of paired transistor structures 120, 130 may be interconnected through one crystalline semiconductor layer 140.

Figure 3:
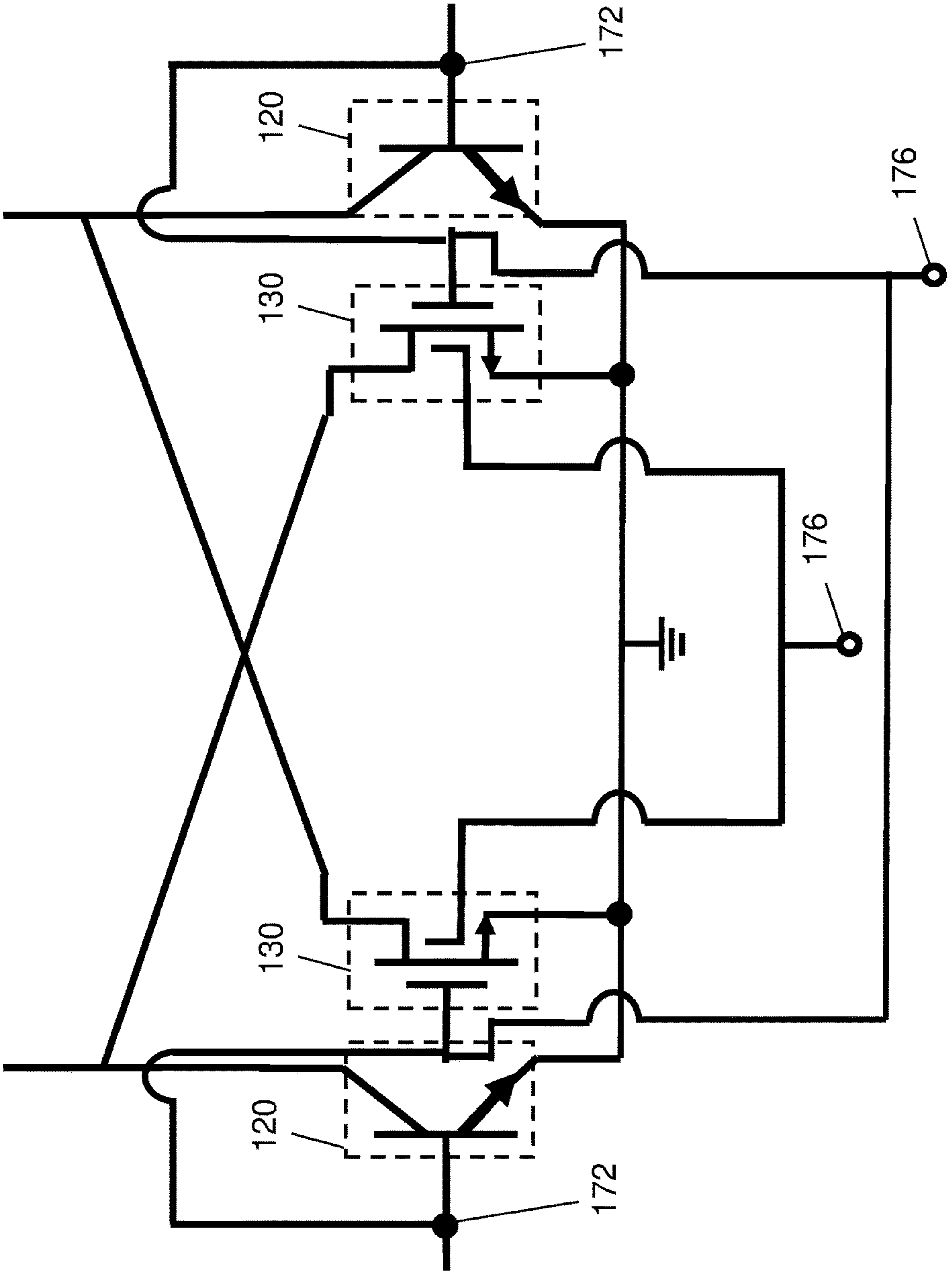
FIG. 3 shows an example circuit diagram implemented by a structure according to embodiments of the disclosure.

FIG. 3 depicts an example circuit diagram that may be implemented through embodiments of structure 100 shown in FIGS. 1 and 2. The diagram of FIG. 3 may be implemented using two pairs of BT structures 120 and FET structures 130, i.e., two implementations of structure 100 in different locations. As shown, the source or drain of each FET structure 130 may be coupled at a shared node to the emitter or drain of a corresponding BT structure 120 (e.g., through crystalline semiconductor layer 140). This coupling is possible due to the uniform composition and doping type of crystalline semiconductor layer 140, thus allowing terminals 142, 144 to be defined therein. In addition, back-gate biasing of all structures 120, 130 is possible through back-gate contacts 176 to back-gate semiconductor layer 104 at different locations. BT structure 120 and FET structure 130, moreover, may be coupled at a shared node through a gate contact 172.

Figure 4:
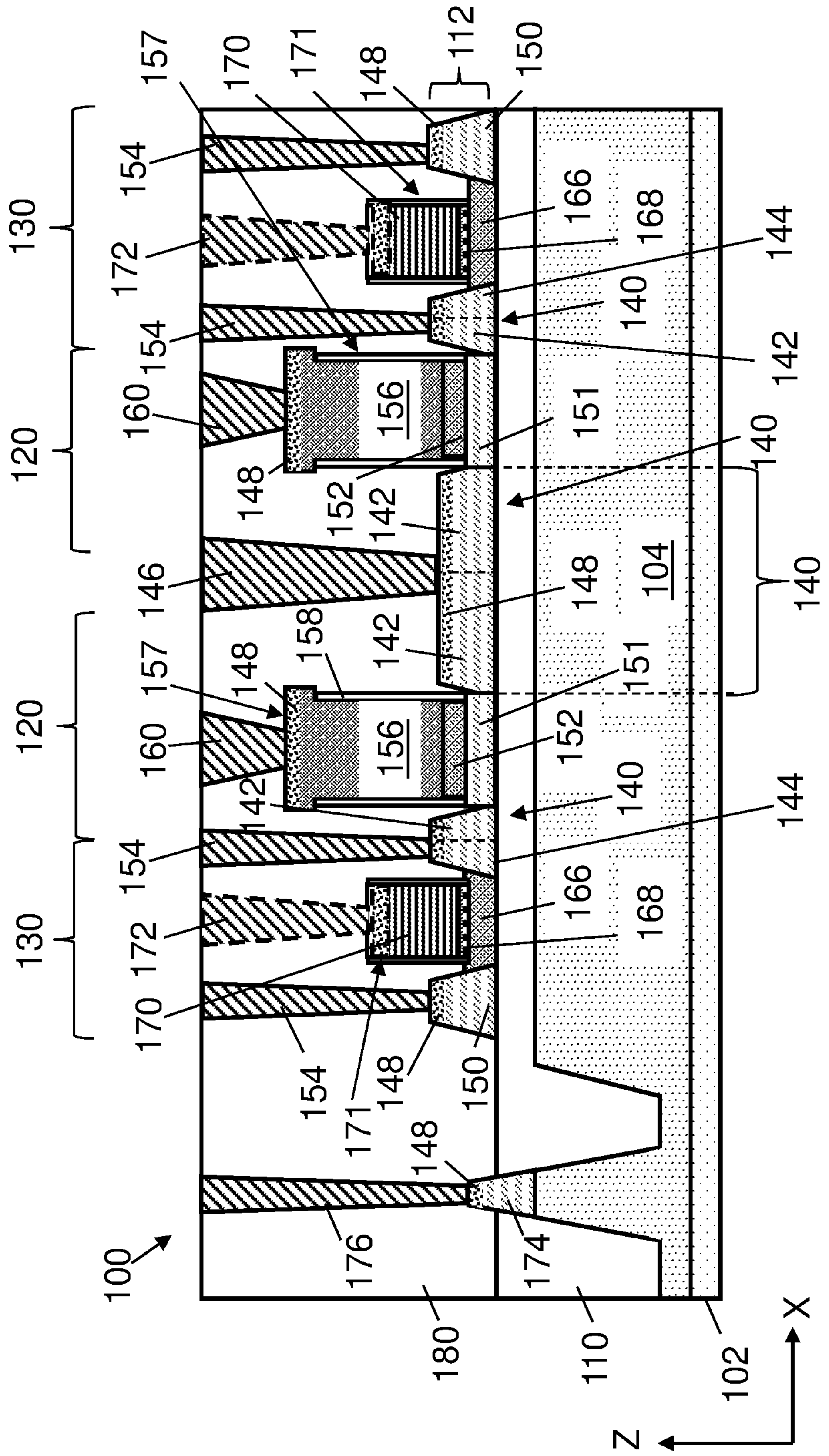
FIG. 4 shows a cross-sectional view of a crystalline semiconductor layer between multiple bipolar transistor structures and multiple FET structures according to embodiments of the disclosure.
Figure 5:
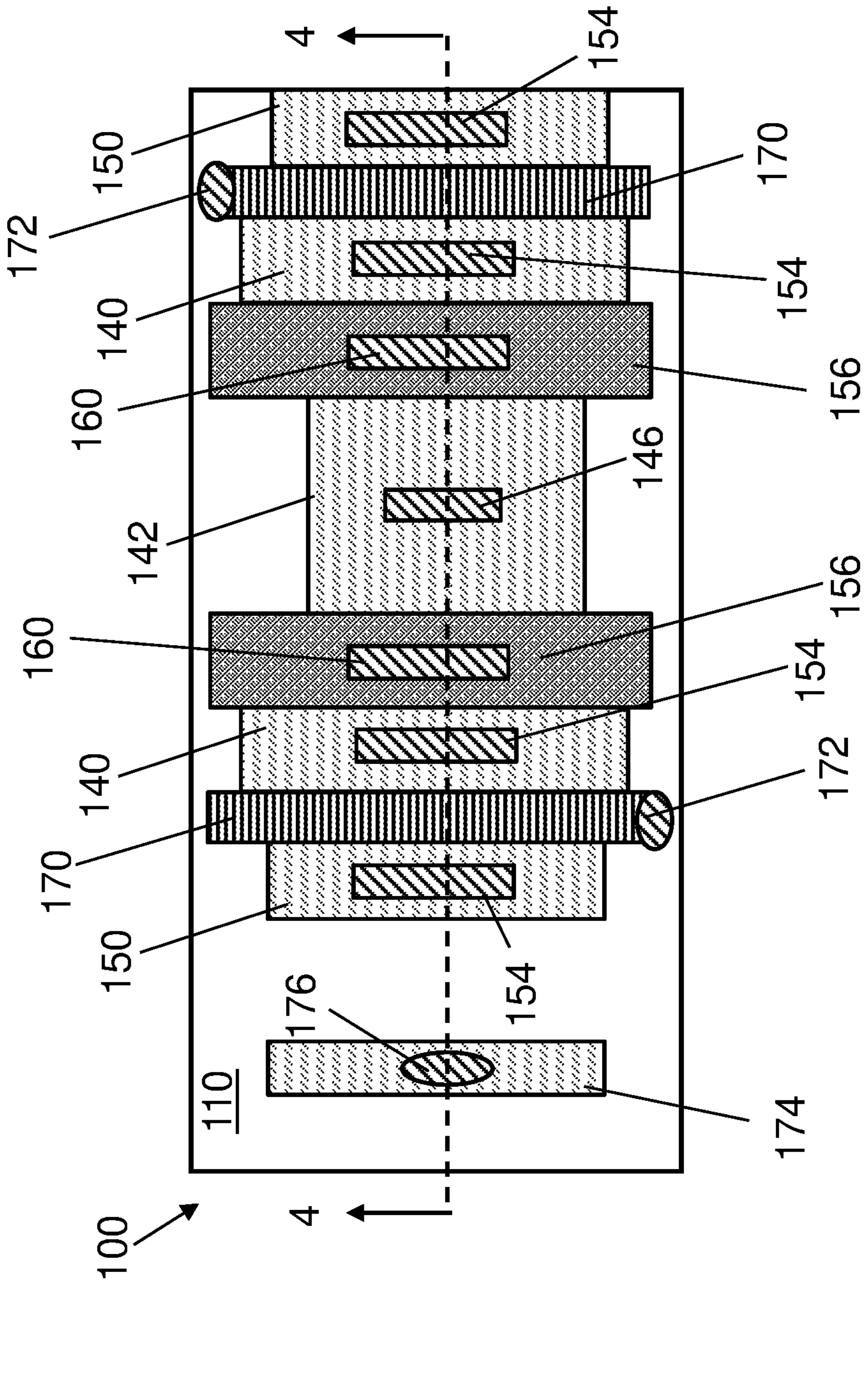
FIG. 5 shows a plan view of a crystalline semiconductor layer between multiple bipolar transistor structures and multiple FET structures according to embodiments of the disclosure.

Referring now to FIGS. 4 and 5, further embodiments of structure 100 may include multiple crystalline semiconductor structures 140 horizontally between multiple pairs of BT structures 120 and FET structures 130. FIG. 4 depicts a cross-sectional view of such a structure and FIG. 5 provides a plan view of the structure with view line 4-4 indicating the perspective in FIG. 4. Structure 100 also includes crystalline semiconductor layer 140 on insulator layer 106 between two BT structures 120. Although not shown, further implementations of structure 100 may include crystalline semiconductor layer 140 between two FET structures 130. In any case, each of the various BT structures 120 and FET structures 130 may be on insulator layer 106, above back-gate semiconductor layer 104. Crystalline semiconductor layer 140, in addition to allowing multiple BT structures 120 and/or FET structures 130 to be formed close to each other over insulator layer 106, may allow each of the various structures 120, 130 to be electrically biased through back-gate terminal(s) 174 that are shared for multiple BT structures 120 and/or FET structures 130. Crystalline semiconductor layer 140 between BT structures 120 may include two E/C terminals 142 therein (i.e., one for each adjacent BT structure 120). Other crystalline semiconductor layers 140 between one BT structure 120 and one FET structure 130 may be subdivided into E/C terminals 142 and S/D terminals 144, e.g., as discussed herein relative to FIG. 1. Apart from the addition of additional BT structures 120, FET structures 130, crystalline semiconductor layers 140, etc., structure 100 otherwise may be similar or identical to embodiments of structure 100 discussed elsewhere herein.

Figure 6:
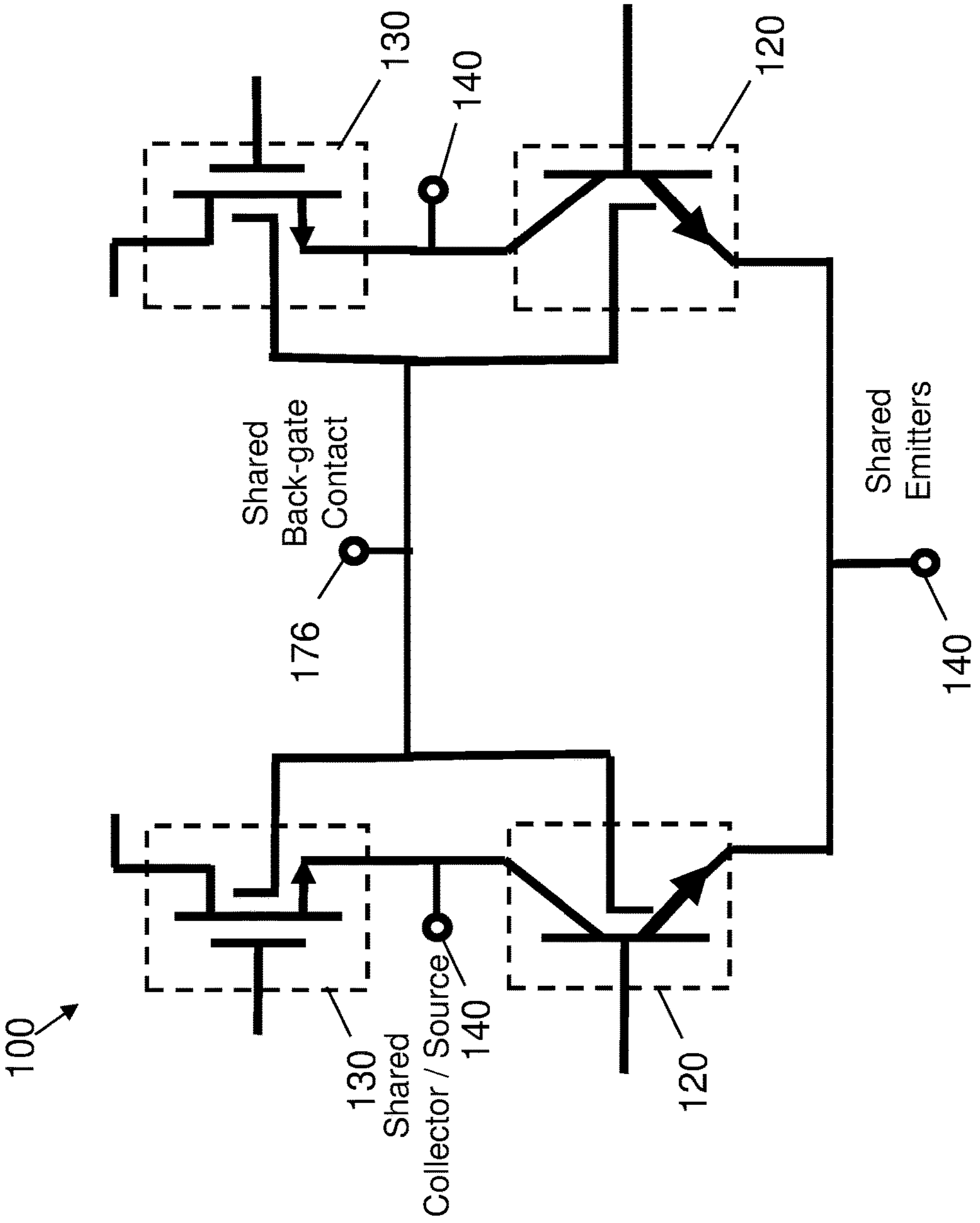
FIG. 6 shows an example circuit diagram implemented by a structure according to further embodiments of the disclosure.

Referring to FIGS. 4-6 together, embodiments of structure 100 may implement pairs of source-collector connected, and/or drain-emitter connected, transistor structures in which a single node electrically biases multiple structures 120, 130 simultaneously. The source-collector and/or drain-emitter connections may be through crystalline semiconductor layer(s) 140 subdivided into terminals 142, 144 discussed herein. Two BT structures 120 (or alternatively, two FET structures 130) may be coupled through another crystalline semiconductor layer 140 having only E/C terminals 142 therein as depicted in FIGS. 4, 5. This configuration may allow source and collector terminals to be shared between structures 120, 130, and also allows emitter terminals to be shared between two BT structures 120. Back-gate contact 176 may be shared for all transistor structures 120, 130 of structure 100, and thus back-gate contact 176 may be a single back-gate node for all transistors in structure 100. In further implementations discussed herein, there may be multiple back-gate contacts 176 for biasing fewer than all transistor structures 120, 130 in structure 100.

Figure 7:
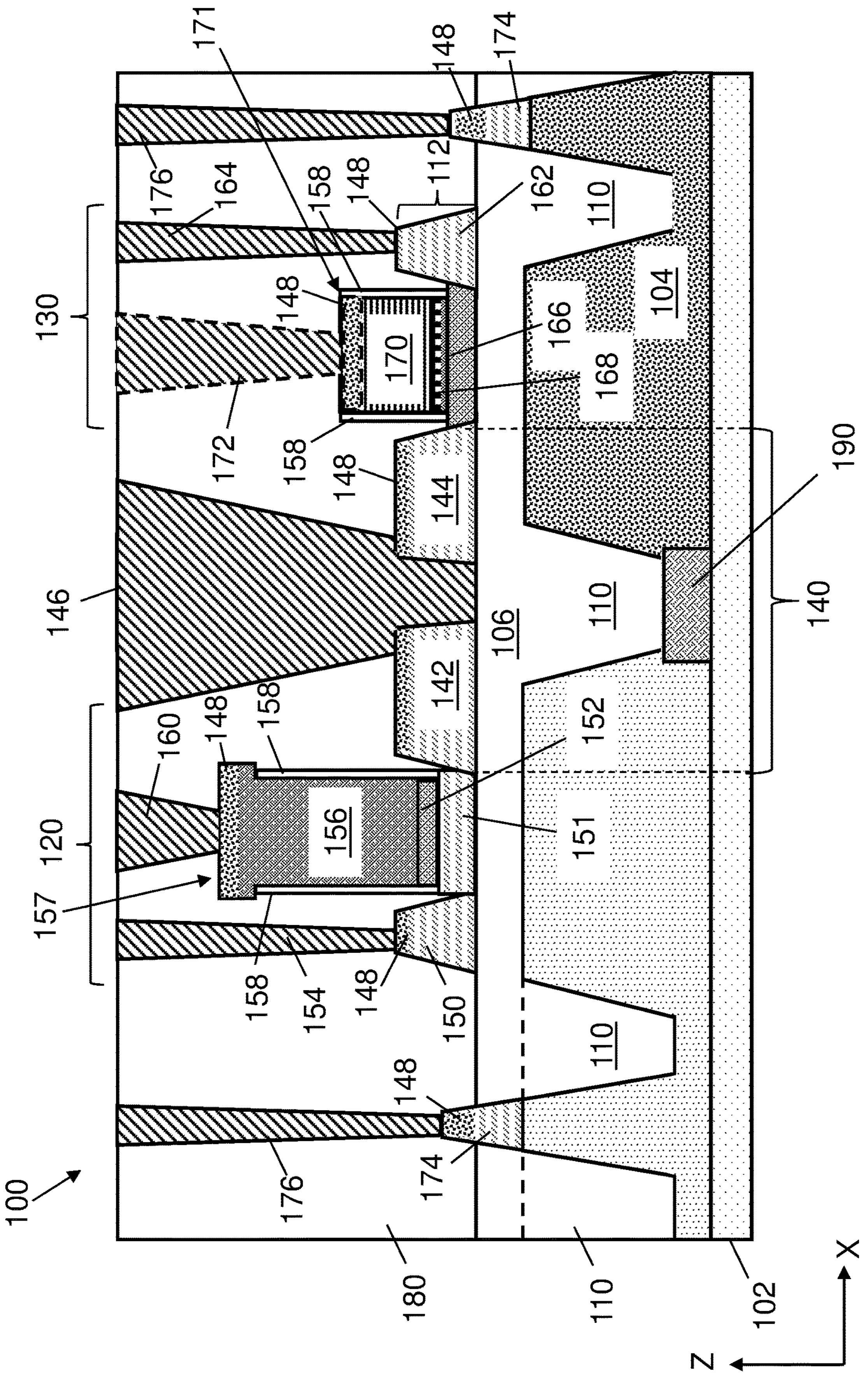
FIG. 7 shows a cross-sectional view of a crystalline semiconductor layer and contact between a bipolar transistor structure and a field effect transistor (FET) structure according to further embodiments of the disclosure.

Referring to FIG. 7, further implementations of structure 100 may include features for independent doping of each region of back-gate semiconductor layer 104, and hence multiple levels of back-gate biasing in back-gate semiconductor layer 104, and/or intermediate contact(s) 146 extending entirely through a portion of crystalline semiconductor layer 140. In some implementations, intermediate contact(s) 146 may pass entirely through the vertical thickness of crystalline semiconductor layer 140 to physically interface with the upper surface of insulator layer 106. Intermediate contact(s) 146 may be wider above crystalline semiconductor layer 140, e.g., to provide a physical interface between intermediate contact(s) 146 and silicide layers 148 on crystalline semiconductor layer 140. In this case, portions of crystalline semiconductor layer 140 horizontally between BT structure 120 and intermediate contact 146 may define E/C terminal 142, and portions of crystalline semiconductor layer 140 horizontally between FET structure 130 and intermediate contact 146 may define S/D terminal 144. Although crystalline semiconductor layer 140 is shown as being discontinuous in the plane depicted in FIG. 7, it is understood that other portions of crystalline semiconductor layer 140 may wrap around intermediate contact 146 in front of, and behind, the plane of the page.

Structure 100 may include further features within back-gate semiconductor layer 104, and these features may be included within other implementations of structure 100 even where intermediate contact(s) 146 do not extend completely through crystalline semiconductor layer 140. Where desired, additional TIs 110 may define multiple back-gate semiconductor regions 104 beneath BT structures 120 and FET structures 130, such that each of the various gate semiconductor regions 104 may electrically bias only certain BT structures 120 and/or FET structures 130. Back-gate semiconductor layer 104 may include one or more deep well barriers 190 to electrically separate back-gate semiconductor layer 104 into different regions with different doping types. For instance, deep well barrier 190 may be below intermediate contact(s) 146 and may be highly doped p-type. Portions of back-gate semiconductor layer 104 on each side of deep well barrier 190 may each have the opposite doping type from deep well barrier 190 (e.g., they each may be doped n-type), but the presence of deep well barrier 190 and TI 110 allows the different portions of back-gate semiconductor layer 104 on each side of deep well barrier 190 to have independent electrical biasing levels. To provide the different amounts of electrical biasing, different additional back-gate contacts 176 to back-gate semiconductor layer 104 may be provided on each side of deep well barrier 190.

Figure 8:
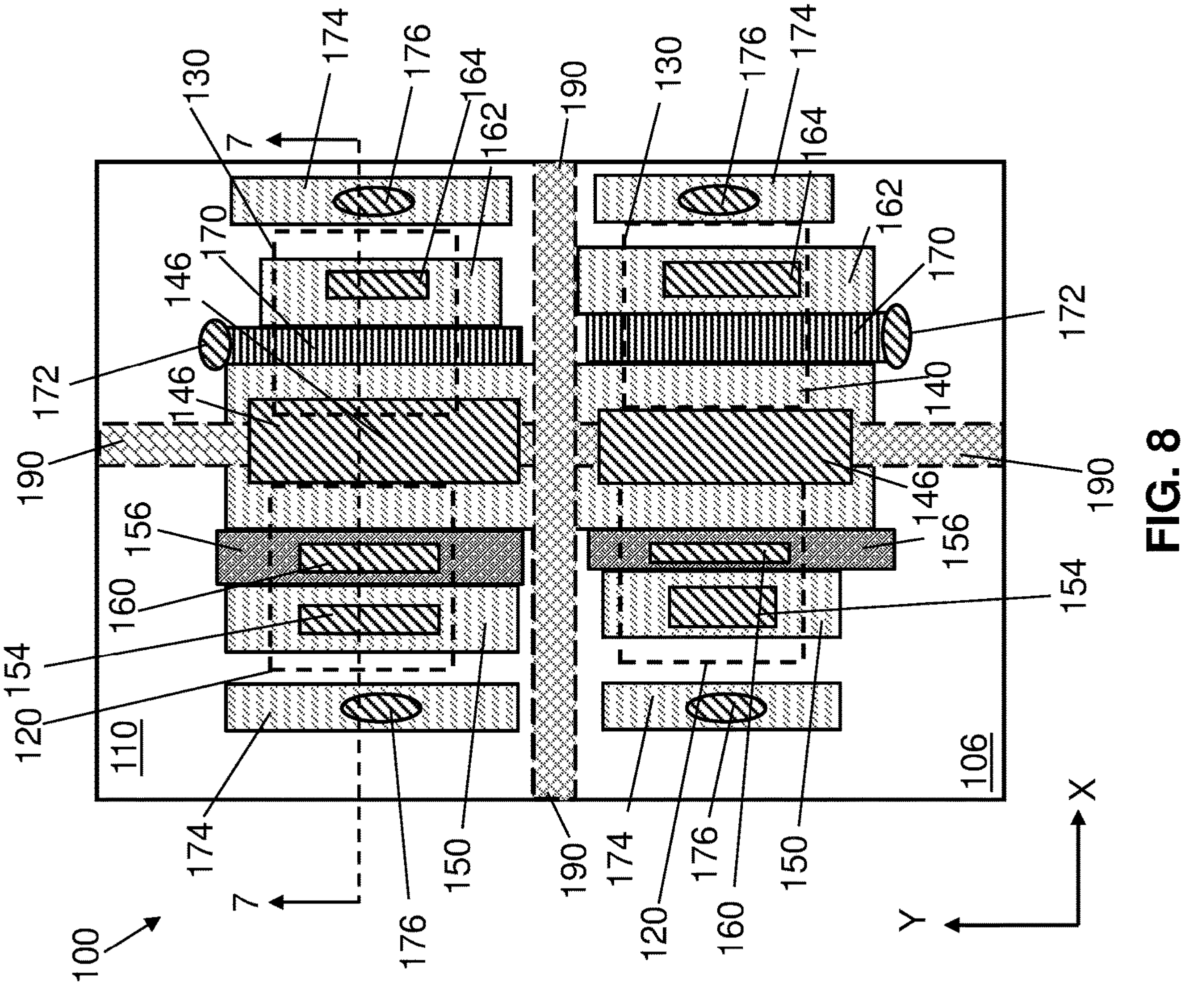
FIG. 8 shows a plan view of a structure according to further embodiments of the disclosure.
Figure 9:
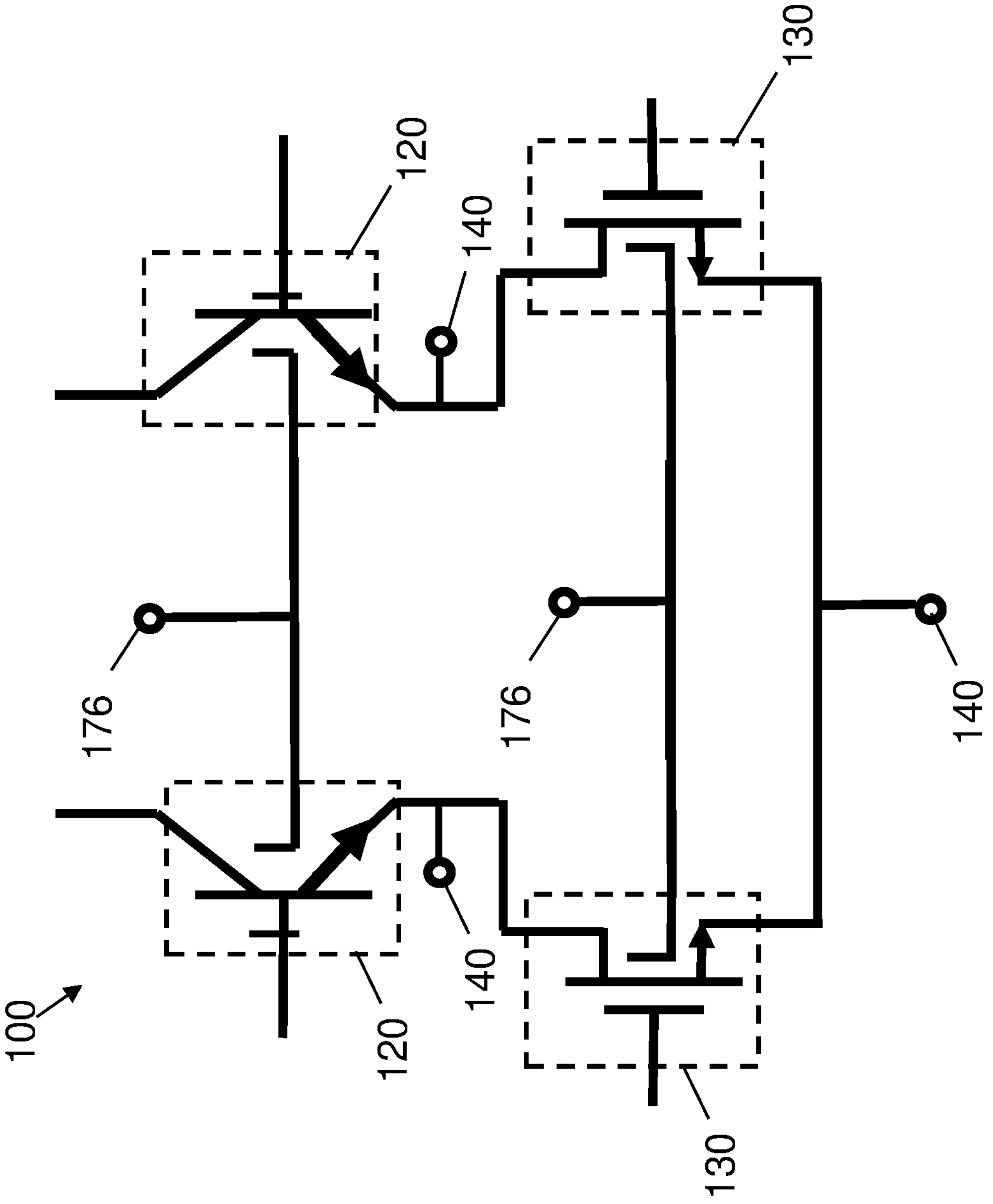
FIG. 9 shows an example circuit diagram implemented in a structure according to further embodiments of the disclosure.

Referring to FIGS. 8 and 9 together, one BT structure 120 and FET structure 130 may be intercoupled through a shared portion of back-gate semiconductor layer 104, or through an equivalent via contact and metal wire connection (not shown). Another BT structure 120 and FET structure 130 may share back-gate terminals through another portion of back-gate semiconductor layer 104. Deep well barrier 190 may physically and electrically separate the different portions of back-gate semiconductor layer 104 from each other, such that different back-gate terminals 174 electrically bias desired pairs of structures 120, 130. In this case, each pair of structures 120, 130 may have an independently controllable back-gate bias applied thereto. In such cases, separate back-gate contacts 176 to each structure 120, 130 may be provided to control the amount of back-gate biasing. It is also understood that extrinsic bases 156 and gate conductors 170 of each structure 120, 130 may be coupled to separate nodes and hence independently controllable.

Figure 10:
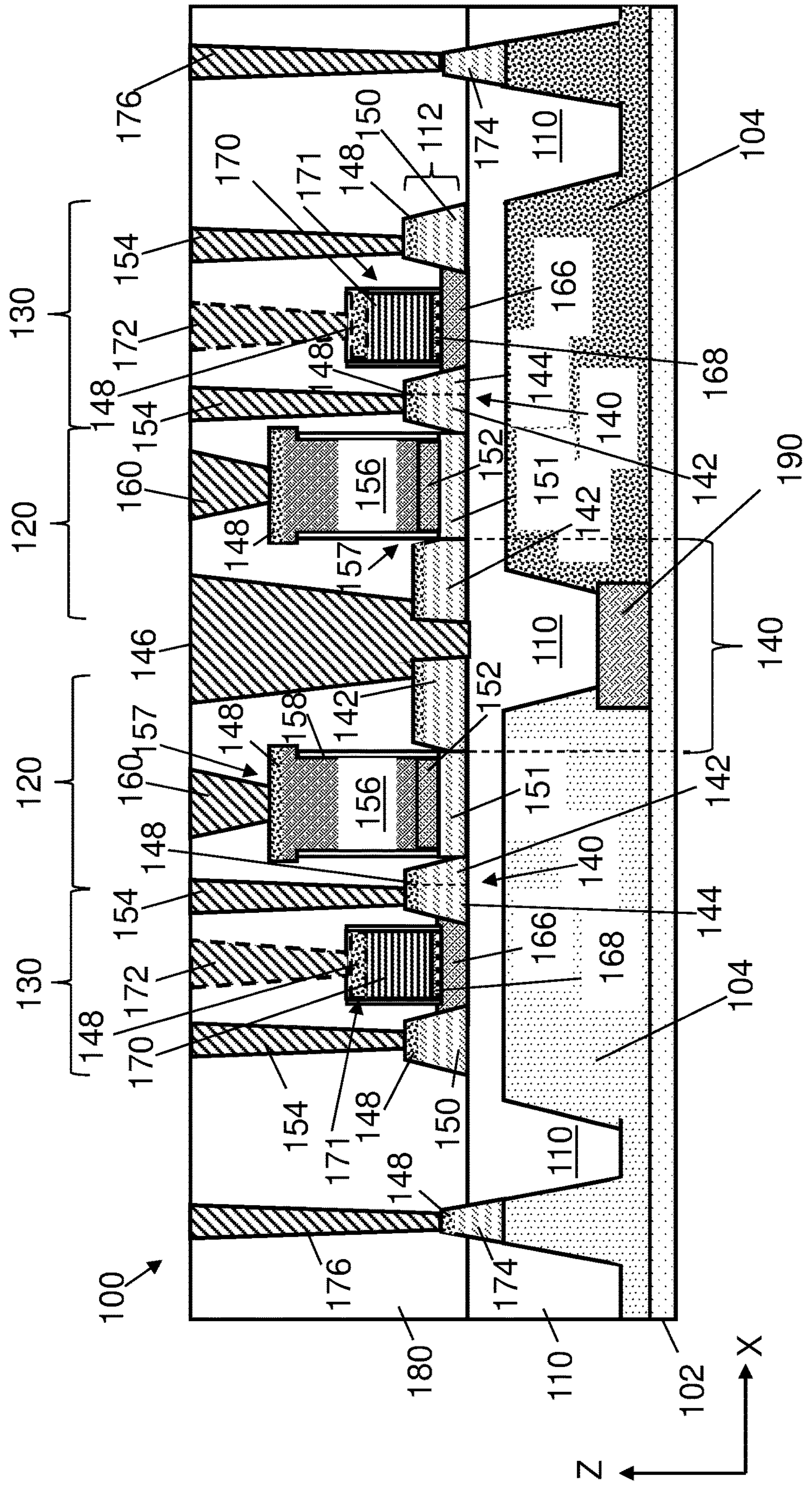
FIG. 10 shows a cross-sectional view of a crystalline semiconductor layer and contact between multiple bipolar transistor structures and multiple FET structures according to embodiments of the disclosure.

FIG. 10 depicts yet another implementation of structure 100 where, similar to FIGS. 4 and 5, multiple crystalline semiconductor structures 140 are located horizontally between multiple pairs of BT structures 120 and FET structures 130. Structure 100 also includes crystalline semiconductor layer 140 on insulator layer 106 between two BT structures 120, with intermediate contact 146 extending vertically therethrough to insulator layer 106 (e.g., as also shown in FIG. 5 and discussed herein). In addition, deep well barrier 190 may be within deep well semiconductor layer 104 to allow different portions thereof to have different amounts of back-gate biasing and/or different amounts of doping. According to an example, one portion of back-gate semiconductor layer 104 may provide back-gate biasing to BT structure 120 and FET structure 130 on one side of intermediate contact 146, and another portion of back-gate semiconductor layer may provide back-gate biasing to BT structure 120 and FET structure 130 on another side of intermediate contact 146.

Each portion of back-gate semiconductor layer 104 on a respective side of deep well barrier 190 may be coupled to its own back-gate terminal 174 and back-gate contact 176. It is understood that additional deep well barriers 190 and/or back-gate terminals 174 and back-gate contacts 176 may be included to allow individual biasing of each BT structure 120 and/or FET structure 130. Apart from the presence of several BT structures 120, FET structures 130, crystalline semiconductor layers 140, back-gate terminals 174, back-gate contacts 176, and the presence of deep well barrier 190, structure 100 otherwise may be similar or identical to embodiments of structure 100 discussed elsewhere herein.

During operation, the source-collector and/or drain-emitter connections may be through crystalline semiconductor layer(s) 140 subdivided into terminals 142, 144 discussed herein. Two BT structures 120 (or alternatively, two FET structures 130) may be coupled through another crystalline semiconductor layer 140 having only E/C terminals 142 therein as depicted in FIG. 7. One back-gate contact 176 may be coupled to a portion of back-gate semiconductor layer 104 on one side of deep well barrier 190, and another back-gate contact 176 may be coupled to a portion of back-gate semiconductor layer 104 on another side of deep well barrier 190. In further implementations, there may be yet more back-gate contacts 176 for individually biasing any of BT structures 120 and/or FET structures 130 by including additional back-gate terminals 174, back-gate contacts 176, and deep well barriers 190 in structure 100.

Embodiments of the disclosure may provide several technical advantages, examples of which are discussed herein. For example, embodiments of the disclosure allow BT structures 120 and bipolar transistor structures 130 to be provided together over a single back-gate semiconductor layer 104 via the presence of crystalline semiconductor layer 140. The composition and doping of crystalline semiconductor layer 140 may be substantially uniform despite the presence of E/C terminal 142 and S/D terminal 144 therein. These structural characteristics allow structure 100 to occupy less surface area on a device than conventional groups of bipolar transistors and FETs. During operation, the ability to apply the same back-gate bias to BT structures 120 and FET structures 130 may accommodate higher performance requirements for certain bipolar transistors and may reduce total power consumption in a device.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure comprising:

a dielectric layer on a back-gate semiconductor layer;

a bipolar transistor structure on the dielectric layer;

an emitter/collector (E/C) layer on the dielectric layer and the bipolar transistor structure;

a source/drain (S/D) layer on the dielectric layer;

a contact on the dielectric layer horizontally between the emitter/collector (E/C) layer and the source drain (S/D) layer;

a field effect transistor (FET) structure on the dielectric layer and adjacent to the source/drain (S/D) layer; and a crystalline semiconductor layer on the dielectric layer between the bipolar transistor structure and the FET structure, wherein the crystalline semiconductor layer includes a terminal of the bipolar transistor structure and a terminal of the FET structure.

2. The structure of claim 1, wherein the crystalline semiconductor layer includes a shared emitter/collector (E/C) and source/drain (S/D) semiconductor material having a single composition between the bipolar transistor structure and the FET structure.

3. The structure of claim 1, further comprising a trench isolation (TI) within the back-gate semiconductor layer below the contact, wherein a first portion of the back-gate semiconductor layer below the bipolar transistor structure is electrically biased independently of a second portion of the back-gate semiconductor layer below the FET structure.

4. The structure of claim 1, further comprising:

a trench isolation (TI) within the back-gate semiconductor layer; and a back-gate contact to the back-gate semiconductor layer, wherein the TI is between the back-gate contact and the crystalline semiconductor layer.

5. The structure of claim 1, wherein the bipolar transistor structure includes:

an intrinsic base layer over the dielectric layer and coupled to the crystalline semiconductor structure, wherein the intrinsic base layer has an opposite doping type from the crystalline semiconductor layer;

an extrinsic base layer on the intrinsic base layer, wherein the extrinsic base layer is substantially T-shaped; and a spacer on the intrinsic base layer and adjacent the extrinsic base layer, wherein an upper portion of the extrinsic base layer is above the spacer.

6. The structure of claim 5, wherein the intrinsic base layer includes p-doped silicon germanium (SiGe).

7. A structure comprising:

a dielectric layer on a back-gate semiconductor layer;

a crystalline semiconductor layer on the dielectric layer;

a trench isolation (TI) within the back-gate semiconductor layer, wherein the TI is between the back-gate contact and the crystalline semiconductor layer;

a base structure on the dielectric layer and adjacent a first horizontal end of the crystalline semiconductor layer; and a gate structure on the dielectric layer and adjacent a second horizontal end of the crystalline semiconductor layer, wherein the crystalline semiconductor layer is horizontally between the base structure and the gate structure.

8. The structure of claim 7, wherein the crystalline semiconductor layer includes a shared emitter/collector (E/C) and source/drain (S/D) semiconductor material having a single composition between the base structure and the gate structure.

9. The structure of claim 7, wherein the base structure is coupled to the gate structure.

10. The structure of claim 7, wherein the base structure and the gate structure are in one of a plurality of FET-bipolar transistor pairs having the crystalline semiconductor layer horizontally therebetween.

11. The structure of claim 7, wherein the base structure includes:

an intrinsic base layer over the dielectric layer and having an opposite doping type from the crystalline semiconductor layer;

an extrinsic base layer on the intrinsic base layer, wherein the extrinsic base layer is substantially T-shaped; and a spacer on the intrinsic base layer and adjacent the extrinsic base layer, wherein an upper portion of the extrinsic base layer is above the spacer.

12. The structure of claim 7, further comprising:

an additional base structure on the dielectric layer; and an additional crystalline semiconductor layer on the dielectric layer between the bipolar transistor structure and the additional base structure, wherein the additional crystalline semiconductor layer defines a shared emitter terminal within a first bipolar transistor including the base structure, and the additional base structure.

13. A structure comprising:

a dielectric layer on a back-gate semiconductor layer;

a contact to the dielectric layer;

an emitter/collector (E/C) layer on the dielectric layer and adjacent a first horizontal end of the contact;

a base structure on the dielectric layer and adjacent the E/C layer, wherein the E/C layer is horizontally between the base structure and the first horizontal end of the contact;

a source/drain (S/D) layer on the dielectric layer and adjacent a second horizontal end of the contact; and a gate structure on the dielectric layer and adjacent the S/D layer, wherein the S/D layer is horizontally between the contact and the gate structure.

14. The structure of claim 13, further comprising a trench isolation (TI) within the back-gate semiconductor layer below the contact, wherein a first portion of the back-gate semiconductor layer below the base structure is electrically biased independently of a second portion of the back-gate semiconductor layer below the gate structure.

15. The structure of claim 13, further comprising:

a trench isolation (TI) within the back-gate semiconductor layer; and a back-gate contact to the back-gate semiconductor layer, wherein the TI is between the back-gate contact and the contact.

16. The structure of claim 13, wherein the base structure includes:

an intrinsic base layer over the dielectric layer and having an opposite doping type from the E/C layer;

an extrinsic base layer on the intrinsic base layer, wherein the extrinsic base layer is substantially T-shaped; and a spacer on the intrinsic base layer and adjacent the extrinsic base layer, wherein an upper portion of the extrinsic base layer is above the spacer.

17. The structure of claim 16, wherein the intrinsic base layer includes p-doped silicon germanium (SiGe).

18. The structure of claim 13, wherein the base structure is coupled to the gate structure.

* * * * *